US009516739B2

(12) United States Patent
Lee et al.

(10) Patent No.: US 9,516,739 B2
(45) Date of Patent: Dec. 6, 2016

(54) HEAT DISSIPATION MATERIAL AND LIGHT EMITTING DIODE PACKAGE INCLUDING A JUNCTION PART MADE OF THE HEAT DISSIPATION MATERIAL

(71) Applicants: Eun Sung Lee, Seoul (KR); Sang Soo Jee, Hwaseong-si (KR); Kun Mo Chu, Seongnam-si (KR); Se Yun Kim, Seoul (KR); Kyu Hyoung Lee, Yongin-si (KR); Sang Mock Lee, Yongin-si (KR)

(72) Inventors: Eun Sung Lee, Seoul (KR); Sang Soo Jee, Hwaseong-si (KR); Kun Mo Chu, Seongnam-si (KR); Se Yun Kim, Seoul (KR); Kyu Hyoung Lee, Yongin-si (KR); Sang Mock Lee, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/547,673

(22) Filed: Nov. 19, 2014

(65) Prior Publication Data

US 2015/0069455 A1    Mar. 12, 2015

Related U.S. Application Data

(62) Division of application No. 13/213,730, filed on Aug. 19, 2011, now Pat. No. 9,000,473.

(30) Foreign Application Priority Data

Aug. 20, 2010   (KR) .................. 10-2010-0081007

(51) Int. Cl.
*H01L 33/62*     (2010.01)
*H05K 1/02*      (2006.01)
(Continued)

(52) U.S. Cl.
CPC ............ *H05K 1/0203* (2013.01); *B23K 35/26* (2013.01); *C22C 45/00* (2013.01); *H01L 33/62* (2013.01);
(Continued)

(58) Field of Classification Search
CPC ...... H01L 33/64; H01L 33/641; H01L 33/644; H01L 33/647; H01L 33/62; H01L 2023/34; H01L 2023/40; H01L 2023/4018; H01L 2023/4087; H01L 2023/4068; H01L 2023/4037; H01L 24/01
See application file for complete search history.

(56) References Cited

U.S. PATENT DOCUMENTS 6,652,679 B1 * 11/2003 Inoue ............... B22D 27/09
148/561
7,488,170 B2 * 2/2009 Yuasa ............ B29D 11/00413
106/38.27
(Continued)

FOREIGN PATENT DOCUMENTS

| KR | 20090104808 A | 10/2009 |
|----|---------------|---------|
| KR | 20100021037 A | 2/2010 |
| KR | 20100071968 A | 6/2010 |
| KR | 20100095021 A | 8/2010 |
| WO | WO-2009094558 A2 | 7/2009 |

*Primary Examiner* — Selim Ahmed
(74) *Attorney, Agent, or Firm* — Harness, Dickey & Pierce, P.L.C.

(57) ABSTRACT

Disclosed are a heat dissipation material comprising a metallic glass and an organic vehicle and a light emitting diode package including at least one of a junction part, wherein the junction part includes a heat dissipation material including a metallic glass.

15 Claims, 1 Drawing Sheet

(51) Int. Cl.
*B23K 35/26* (2006.01)
*C22C 45/00* (2006.01)
*H01L 33/64* (2010.01)
*H05K 3/00* (2006.01)
*H05K 3/32* (2006.01)
*H05K 3/34* (2006.01)

(52) U.S. Cl.
CPC ............ *H01L 33/641* (2013.01); *H01L 33/642* (2013.01); *H01L 33/644* (2013.01); *H01L 2224/32245* (2013.01); *H01L 2224/48091* (2013.01); *H01L 2224/48247* (2013.01); *H01L 2224/48465* (2013.01); *H01L 2224/73265* (2013.01); *H01L 2924/12044* (2013.01); *H05K 3/0061* (2013.01); *H05K 3/32* (2013.01); *H05K 3/3463* (2013.01); *H05K 2201/10106* (2013.01)

(56) References Cited

U.S. PATENT DOCUMENTS

| | | | |
|---|---|---|---|
| 8,715,535 | B2 | 5/2014 | Jee et al. |
| 2005/0228097 | A1* | 10/2005 | Zhong .................... B82Y 30/00 524/430 |
| 2006/0076089 | A1 | 4/2006 | Chang et al. |
| 2007/0241363 | A1 | 10/2007 | Yen |
| 2008/0019133 | A1 | 1/2008 | Kim et al. |
| 2008/0248222 | A1* | 10/2008 | Ohara .................... B32B 15/01 428/34.6 |
| 2009/0032970 | A1* | 2/2009 | Park ........................ H01L 24/81 257/777 |
| 2009/0052178 | A1 | 2/2009 | Marchl et al. |
| 2009/0134767 | A1 | 5/2009 | Cho et al. |
| 2009/0279300 | A1 | 11/2009 | Okajima et al. |
| 2011/0089462 | A1 | 4/2011 | Van Heerden et al. |

* cited by examiner

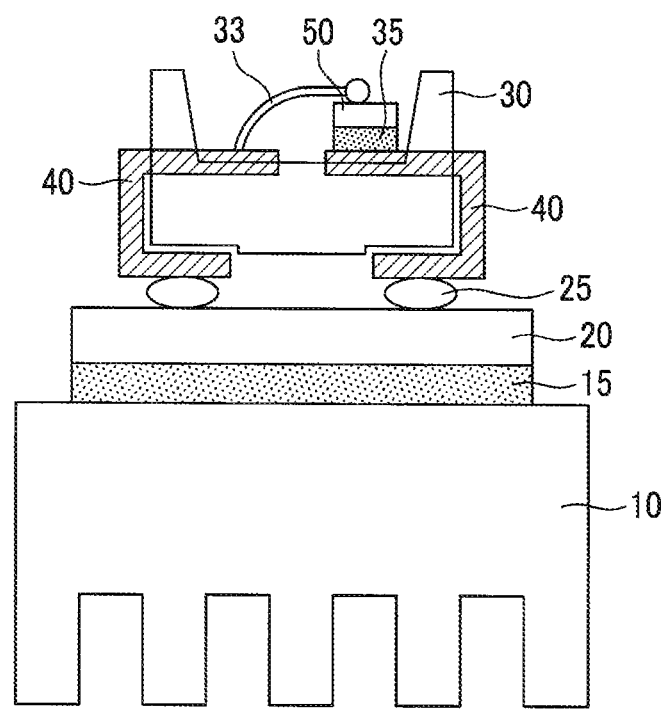

HEAT DISSIPATION MATERIAL AND LIGHT EMITTING DIODE PACKAGE INCLUDING A JUNCTION PART MADE OF THE HEAT DISSIPATION MATERIAL

CROSS-REFERENCE TO RELATED APPLICATION

This application is a divisional of U.S. application Ser. No. 13/213,730, filed on Aug. 19, 2011, which claims priority to and the benefit of Korean Patent Application No. 10-2010-0081007 filed in the Korean Intellectual Property Office on Aug. 20, 2010, the entire contents of each of which is incorporated herein by reference.

BACKGROUND

1. Field

This disclosure relates to a heat dissipation material and a light emitting diode package including a junction part made of the heat dissipation material.

2. Description of the Related Art

A light emitting diode is a diode that emits light when current flows, and it is applied to a variety of electronic devices. In the light emitting diode, when a forward voltage is applied to a semiconductor material, electrons and holes are transferred and combined through a PN junction, and the energy generated from the combination of electrons and holes is emitted in the form of light and heat. To emit high luminance and high efficiency light, a portion of the energy lost by heat may be reduced and a portion emitted in the form of light may be increased. The light emitting diode may have increased photoefficiency and improved lifespan by reducing thermal loss. The thermal loss is mainly related to a junction point of a light emitting diode.

SUMMARY

An exemplary embodiment of this disclosure provides a heat dissipation material that may improve heat dissipation characteristics.

Another embodiment of this disclosure provides a light emitting diode package including a junction part formed of the heat dissipation material.

According to one aspect of this disclosure, a heat dissipation material including a metallic glass and an organic vehicle is provided.

The metallic glass may have a supercooled liquid region.

The supercooled liquid region may be a temperature region between a glass transition temperature and a crystallization temperature of the metallic glass, and the metallic glass may have a liquid-like behavior in the supercooled liquid region.

The metallic glass may have a supercooled liquid region ranging from about 5° C. to about 200° C.

The metallic glass may have a glass transition temperature of about 150° C. to 500° C.

The metallic glass may include an alloy including at least one of aluminum (Al), copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), hafnium (Hf), niobium (Nb), lead (Pb), platinum (Pt), silver (Ag), phosphorus (P), boron (B), silicon (Si), carbon (C), tin (Sn), molybdenum (Mo), tungsten (W), manganese (Mn), erbium (Er), chromium (Cr), praseodymium (Pr), thulium (Tm), or a combination thereof.

The metallic glass may include an alloy including at least one of aluminum (Al), copper (Cu), or a combination thereof.

The heat dissipation material may further include a thermal conductive particle.

The thermal conductive particle may include at least one of aluminum (Al), copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), hafnium (Hf), niobium (Nb), lead (Pb), platinum (Pt), silver (Ag), phosphorus (P), boron (B), silicon (Si), carbon (C), tin (Sn), molybdenum (Mo), tungsten (W), manganese (Mn), erbium (Er), chromium (Cr), praseodymium (Pr), thulium (Tm), or a combination thereof.

The thermal conductive particle may include at least one of aluminum (Al), copper (Cu), silver (Ag), tin (Sn), or a combination thereof.

According to another aspect of this disclosure, a light emitting diode package includes at least one of a junction part, wherein the junction part may be included a heat dissipation material including a metallic glass.

The light emitting diode package may further include light emitting diode chip; a metal wire electrically connected to the light emitting diode chip; and a printed circuit board electrically connected to the metal wire, wherein the junction part may include a first junction part disposed between the light emitting diode chip and the metal wire, and a second junction part disposed between the metal wire and the printed circuit board.

The light emitting diode package may further include a heat dissipating plate disposed under the printed circuit board, and the junction part may further include a third junction part disposed between the printed circuit board and the heat dissipating plate.

The heat dissipation material may further include a thermal conductive particle.

The thermal conductive particle may include at least one of aluminum (Al), copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), hafnium (Hf), niobium (Nb), lead (Pb), platinum (Pt), silver (Ag), phosphorus (P), boron (B), silicon (Si), carbon (C), tin (Sn), molybdenum (Mo), tungsten (W), manganese (Mn), erbium (Er), chromium (Cr), praseodymium (Pr), thulium (Tm), or a combination thereof.

The thermal conductive particle may include at least one of aluminum (Al), copper (Cu), silver (Ag), tin (Sn), or a combination thereof.

BRIEF DESCRIPTION OF THE DRAWING

FIG. 1 is a cross-sectional view showing a light emitting diode package according to one embodiment.

DETAILED DESCRIPTION

Exemplary embodiments will hereinafter be described in further detail with reference to the accompanying drawings, in which various embodiments are shown. This disclosure may, however, be embodied in many different forms and should not be construed as limited to the exemplary embodiments set forth herein.

As used herein, the term "and/or" includes any and all combinations of one or more of the associated listed items. It will be understood that, although the terms "first," "second," "third" etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. The term "at least one" means a combination comprising one or more of the listed components may be used.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereafter, the term "element" refers to a metal and a semimetal.

First, a heat dissipation material according to one embodiment of this disclosure is described.

The heat dissipation material according to one embodiment includes a metallic glass and an organic vehicle.

The metallic glass includes an alloy having a disordered atomic structure including two or more elements. The metallic glass may be an amorphous metal. The metallic glass may have about 50 to about 100 weight percent ("wt %"), specifically about 70 to about 100 wt %, more specifically about 90 to about 100 wt % amorphous content, based on a total weight of the metallic glass. Because the metallic glass has a low resistivity, and thus is different from an insulating glass such as a silicate, it may be considered to be an electrical conductor.

The metallic glass has a supercooled liquid region ($\Delta Tx$). The supercooled liquid region ($\Delta Tx$) is a region between a glass transition temperature (Tg) and a crystallization temperature (Tc) of metallic glass. In the supercooled liquid region, a metallic glass has relatively low viscosity and goes through plastic deformation and shows a liquid-like behavior.

The supercooled liquid region ($\Delta Tx$) of metallic glass ranges from about 5° C. to about 200° C. Within the range, the supercooled liquid region ($\Delta Tx$) of the metallic glass may range from about 5° C. to about 100° C. In the supercooled liquid region ($\Delta Tx$), the metallic glass has a liquid-like behavior and it may form a junction point with respect to a lower layer and an upper layer.

Meanwhile, the metallic glass may have glass transition temperature (Tg), the starting temperature of the supercooled liquid region ($\Delta Tx$), of about 150° C. to about 500° C. By having a glass transition temperature of about 150° C. to about 500° C., a relatively low temperature, the metallic glass may be applied as a junction point to a light emitting diode package, as mentioned later.

The metallic glass may have an equivalent thermal conductivity, compared to a conventional metal solder, such as a Au—Sn solder or a Sn—Ag—Cu solder. Accordingly, the heat dissipation material including the metallic glass may be applied as a junction point between the lower layer and the upper layer.

The metallic glass may include an alloy including at least one of aluminum (Al), copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), hafnium (Hf), niobium (Nb), lead (Pb), platinum (Pt), silver (Ag), phosphorus (P), boron (B), silicon (Si), carbon (C), tin (Sn), molybdenum (Mo), tungsten (W), manganese (Mn), erbium (Er), chromium (Cr), praseodymium (Pr), thulium (Tm), or a combination thereof.

In one embodiment, the metallic glass may include an alloy including at least one of aluminum (Al), copper (Cu), or a combination thereof, and in another embodiment, the metallic glass may include an alloy including aluminum (Al) or an aluminum-copper (Al—Cu) alloy.

The following Table 1 shows examples of alloys including aluminum (Al).

TABLE 1

| | Glass transition temperature (Tg, ° C.) | Crystallization temperature (Tc, ° C.) | Supercooled liquid region (ΔTx) |
|---|---|---|---|
| $Al_{85.35}Y_8Fe_6V_{0.65}$ | 285 | 365 | 80 |
| $Al_{85}Y_8Fe_6V_{0.65}O_{0.35}$ | 285 | 355 | 70 |
| $Al_{84.35}Y_8Fe_6V_{0.65}O$ | 285 | 355 | 70 |
| $Al_{87.5}Y_7Fe_5V_{0.5}$ | 280 | 340 | 60 |
| $Al_{87.5}Y_7Fe_5Ti_{0.5}$ | 275 | 310 | 35 |
| $Al_{87}Y_7Fe_5Ti$ | 270 | 340 | 70 |
| $Al_{86}Y_7Fe_5Ti_2$ | 280 | 350 | 70 |
| $Al_{88}Y_7Fe_5$ | 258 | 280 | 22 |
| $Al_{84}Ni_{10}Ce_6$ | 273 | 286 | 13 |
| $Al_{88}Ni_4Sm_8$ | 220 | 241 | 21 |
| $Al_{85}Y_8Ni_5Co_2$ | 267 | 297 | 30 |
| $Al_{85}Gd_8Ni_5Co_2$ | 281 | 302 | 21 |
| $Al_{85}Dy_8Ni_5Co_2$ | 277 | 303 | 26 |
| $Al_{85}Er_8Ni_5Co_2$ | 274 | 305 | 31 |
| $Al_{85}Ni_{10}Ce_5$ | 246 | 264 | 18 |
| $Al_{84}La_6Ni_{10}$ | 273 | 289 | 16 |

The metallic glass may be formed according to known methods such as a melt spinning method, an infiltration casting method, a gas atomization method, an ion irradiation method, or a mechanical alloying method.

The organic vehicle may include an organic compound, an optional organic solvent, and optional additives known for use in the manufacture of heat dissipation materials for electronic devices. The organic vehicle is combined with the metallic glass primarily to provide a viscosity and rheology to the heat dissipation material effective for printing or coating the heat dissipation material. A wide variety of inert organic materials can be used, and can be selected by one of ordinary skill in the art without undue experimentation to achieve the desired viscosity and rheology, as well as other properties such as dispersibility of the metallic glass, stability of the metallic glass and any dispersion thereof, drying rate, firing properties, and the like. Similarly, the relative amounts of the organic compound, any optional organic solvent, and any optional additive can be adjusted by one of ordinary skill in the art without undue experimentation in order to achieve the desired properties of the heat dissipation material.

The organic compound may be a polymer, for example, at least one selected from a C1 to C4 alkyl (meth)acrylate-based resin; a cellulose such as ethyl cellulose or hydroxyethyl cellulose; a phenolic resin; wood rosin; an alcohol resin; a halogenated polyolefin such as tetrafluoroethylene (e.g., TEFLON); and the monobutyl ether of ethylene glycol monoacetate.

The organic vehicle may further optionally include at least one additive selected from, for example, a surfactant, a thickener, and a stabilizer.

The solvent may be any solvent capable of dissolving or suspending the above other components of the heat dissipation material and may be, for example, at least one selected from terpineol, butylcarbitol, butylcarbitol acetate, pentanediol, dipentyne, limonene, an ethyleneglycol alkylether, a diethyleneglycol alkylether, an ethyleneglycol alkylether acetate, a diethyleneglycol alkylether acetate, a diethyleneglycol dialkylether acetate, a triethyleneglycol alkylether acetate, a triethylene glycol alkylether, a propyleneglycol alkylether, propyleneglycol phenylether, a dipropyleneglycol alkylether, a tripropyleneglycol alkylether, a propyleneglycol alkylether acetate, a dipropyleneglycol alkylether acetate, a tripropyleneglycol alkyl ether acetate, dimethylphthalic acid, diethylphthalic acid, dibutylphthalic acid, and desalted water.

The metallic glass and the organic vehicle may be included at about 0.1 to about 99.9 wt % and about 0.1 to about 99.9 wt % based on the total amount of the heat dissipation material, respectively.

Meanwhile, the heat dissipation material may further include a thermal conductive particle. The thermal conductive particle may be selected from metals having a relatively high thermal conductivity. The thermal conductive particle may include at least one of aluminum (Al), copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), hafnium (Hf), niobium (Nb), lead (Pb), platinum (Pt), silver (Ag), phosphorus (P), boron (B), silicon (Si), carbon (C), tin (Sn), molybdenum (Mo), tungsten (W), manganese (Mn), erbium (Er), chromium (Cr), praseodymium (Pr), thulium (Tm), or a combination thereof.

In one embodiment, the thermal conductive particle may be at least one of aluminum (Al), copper (Cu), silver (Ag), tin (Sn), or a combination thereof.

The thermal conductive particle may have a size (e.g., average largest particle size) ranging from about 1 nanometers (nm) to about 50 micrometers (μm), specifically about 0.1 μm to about 40 μm, specifically about 0.5 μm to about 40 μm, more specifically about 1 μm to about 30 μm. The thermal conductive particle may be irregular, or have a spherical, rod-like, or plate-like shape.

The thermal conductive particle may improve a thermal conductivity of the heat dissipation material.

When the thermal conductive particle is included, the metallic glass, the thermal conductive particle and the organic vehicle may be included at about 0.1 wt % to about 99.8 wt %, about 0.1 wt % to about 99.8 wt % and about 0.1 to 99.8 wt % based on the total amount of the heat dissipation material, respectively.

The above-described heat dissipation material may be prepared in the form of a paste and applied to a portion of an electronic device in need of the heat dissipation characteristic through a method such as screen printing or dispensing.

The heat dissipation material may be applied to a junction part of a light emitting diode package among its application fields.

Hereafter, a light emitting diode package adopting the above-described heat dissipation material is described by referring to the accompanying drawings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Referring FIG. 1, a light emitting diode package according to one embodiment is described.

FIG. 1 is a cross-sectional view showing a light emitting diode package according to one embodiment.

The light emitting diode package includes a light emitting diode chip 50, a metal wire 40 connected to a light emitting diode chip 50 through a bonding wire 33 and extended to an outer terminal, a mold 30 housing the light emitting diode chip 50 and fixing the metal wire 40, a printed circuit board 20 disposed under the mold 30, and a heat dissipating plate (heat sink) 10 disposed under the printed circuit board 20.

Meanwhile, the light emitting diode package further includes a first junction part 35 that is disposed between the light emitting diode chip 50 and the metal wire 40 and forming a junction point between them as a junction part, and a second junction part 25 disposed between the metal wire 40 and the printed circuit board 20 and forming a junction point between them as a junction part. Also, the light emitting diode package further includes a third junction part 15 disposed between the printed circuit board 20 and the heat dissipating plate 10 and forming a junction point between them.

The first to third junction parts are directly related to the heat dissipation of the light emitting diode. When the light emitting diode operates, the energy provided to the light emitting diode may be transferred as a form of light and/or heat. If the temperature of the junction parts of the light emitting diode is decreased, the amount of heat generated from the light emitting diode may decrease and the amount of light emitted from the light emitting diode may increase. Further, it is possible to prevent the light emitting diode from being deteriorated by heat, thus the life-span of the light emitting diode may be improved. For example, when the temperature of the junction part is decreased by about 11° C., the amount of generated heat is decreased and thereby the amount of emitted light of the light emitting diode may be increased and the lifespan may be improved to more than double.

To decrease the temperature of the first to third junction parts, the first junction part 35, the second junction part 25, and/or the third junction part 15 may include a metallic glass and be formed using the aforementioned heat dissipation material including the metallic glass. The aforementioned heat dissipation material including a metallic glass may replace a conventional metal solder such as a Au—Sn solder or a Sn—Ag—Cu solder.

As described above, the metallic glass has a supercooled liquid region (ΔTx) where the metallic glass may have a liquid-like behavior and show plastic deformation. Accordingly, a junction point may be formed between a lower layer and an upper layer by reflowing the aforementioned heat dissipation material including the metallic glass, instead of the conventional metal solder. Referring to FIG. 1, the first junction part 35 may form a junction point between the light emitting diode chip 50 and the metal wire 40, while the second junction part 25 may form a junction point between the metal wire 40 and the printed circuit board 20.

Herein, as described above, since the glass transition temperature (Tg) of the metallic glass is about 150° C. to 500° C., the junction points may be formed at a relatively low temperature compared to a conventional, metal solder, and thus is advantageous in terms of processing time and cost.

In addition, since the metallic glass has an equivalent thermal conductivity compared to a conventional metal solder, it may have a sufficient heat dissipation characteristic.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A light emitting diode package comprising:
   at least one junction part within the light emitting diode package, wherein the junction part comprises a heat dissipation material comprising a metallic glass,
   wherein the metallic glass is an alloy having a disordered atomic structure including two or more metals and has a supercooled liquid region that is a temperature region between a glass transition temperature and a crystallization temperature of the metallic glass, and the metallic glass has a liquid-like behavior in the supercooled liquid region, the alloy being a homogenous compound where the two or more metals are atomically bonded together.

2. The light emitting diode package of claim 1, further comprising:
   a light emitting diode chip;
   a metal wire electrically connected to the light emitting diode chip; and
   a printed circuit board electrically connected to the metal wire,
   wherein the junction part comprises:
   a first junction part disposed between the light emitting diode chip and the metal wire; and
   a second junction part disposed between the metal wire and the printed circuit board.

3. The light emitting diode package of claim 2, further comprising a heat dissipating plate disposed under the printed circuit board,
   wherein the junction part further comprises:
   a third junction part disposed between the printed circuit board and the heat dissipating plate.

4. The light emitting diode package of claim 1, wherein the heat dissipation material further comprises a thermal conductive particle.

5. The light emitting diode package of claim 4, wherein the thermal conductive particle comprises at least one of aluminum (Al), copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), hafnium (Hf), niobium (Nb), lead (Pb), platinum (Pt), silver (Ag), phosphorus (P), boron (B), silicon (Si), carbon (C), tin (Sn), molybdenum (Mo), tungsten (W), manganese (Mn), erbium (Er), chromium (Cr), praseodymium (Pr), thulium (Tm), or a combination thereof.

6. The light emitting diode package of claim 5, wherein the thermal conductive particle comprises at least one of aluminum (Al), copper (Cu), silver (Ag), tin (Sn), or a combination thereof.

7. The light emitting diode package of claim 1, wherein the metallic glass has a supercooled liquid region ranging from about 5° C. to about 200° C.

8. The light emitting diode package of claim 1, wherein the metallic glass has a glass transition temperature of about 150° C. to 500° C.

9. The light emitting diode package of claim 1, wherein the metallic glass includes at least one of aluminum (Al), copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), hafnium (Hf), niobium (Nb), lead (Pb), platinum (Pt), silver (Ag), phosphorus (P), boron (B), silicon (Si), carbon (C), tin (Sn), molybdenum (Mo), tungsten (W), manganese (Mn), erbium (Er), chromium (Cr), praseodymium (Pr), thulium (Tm), or a combination thereof.

10. The light emitting diode package of claim 9, wherein the metallic glass alloy includes at least one of aluminum (Al), copper (Cu), or a combination thereof.

11. The light emitting diode package of claim 1, wherein the heat dissipation material further comprises an organic vehicle.

12. The light emitting diode package of claim 6, wherein the thermal conductive particle comprises at least two of aluminum (Al), copper (Cu), silver (Ag) and tin (Sn).

13. The light emitting diode package of claim 7, wherein the metallic glass has a glass transition temperature of about 150° C. to 500° C.

14. The light emitting diode package of claim 10, wherein the metallic glass alloy includes aluminum (Al) and copper (Cu).

15. The light emitting diode package of claim 1, wherein the junction part includes,
- at least one of a first junction part disposed between a light emitting diode chip and a metal wire,
- a second junction part disposed between a metal wire and a printed circuit board, and
- a third junction part disposed between a printed circuit board and a heat dissipating plate.

* * * * *